(12) United States Patent
Jiang et al.

(10) Patent No.: US 11,581,508 B2
(45) Date of Patent: Feb. 14, 2023

(54) THIN FILM PACKAGING STRUCTURE AND DISPLAY PANEL

(71) Applicants: Chengdu BOE Optoelectronics Technology Co., Ltd., Chengdu (CN); BOE TECHNOLOGY GROUP CO., LTD., Beijing (CN)

(72) Inventors: Zhiliang Jiang, Beijing (CN); Shilong Wang, Beijing (CN); Ping Wen, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/926,887

(22) Filed: Jul. 13, 2020

(65) Prior Publication Data
US 2021/0066654 A1   Mar. 4, 2021

(30) Foreign Application Priority Data
Aug. 30, 2019   (CN) .......................... 201910812392.4

(51) Int. Cl.
*H01L 51/00*   (2006.01)
*H01L 51/52*   (2006.01)
(Continued)

(52) U.S. Cl.
CPC .... *H01L 51/5253* (2013.01); *G02F 1/133305* (2013.01); *G06F 1/1641* (2013.01);
(Continued)

(58) Field of Classification Search
CPC ........... H01L 51/5253; H01L 2251/301; H01L 33/44; H01L 23/564; H01L 51/0097;
(Continued)

(56) References Cited

U.S. PATENT DOCUMENTS 7,129,523 B2 * 10/2006 Yamazaki ......... H01L 29/66757
                                                257/E27.111
8,598,786 B1 * 12/2013 Kim .................... H01L 51/5253
                                                313/504
(Continued)

FOREIGN PATENT DOCUMENTS

CN        103325960 A    9/2013
CN        106293197 A    1/2017
(Continued)

OTHER PUBLICATIONS

First Office Action for CN Patent Application No. 201910812392.4 dated Feb. 3, 2021.
(Continued)

*Primary Examiner* — Ida M Soward
(74) *Attorney, Agent, or Firm* — Perilla Knox & Hildebrandt LLP; Kenneth A. Knox

(57) ABSTRACT

This disclosure relates to the field of display technologies and, in particular to a thin film packaging structure and a display panel. A thin film packaging structure includes a first inorganic packaging layer for covering a device to be packaged; an organic packaging layer formed at a side of the first inorganic packaging layer; a second inorganic packaging layer formed at a side of the organic packaging layer facing away from the first inorganic packaging layer; and at least one first inorganic adjusting layer formed at a side of the first inorganic packaging layer facing away from the device to be packaged. The at least one first inorganic adjusting layer has an elasticity modulus greater than that of the first inorganic packaging layer or the second inorganic packaging layer.

19 Claims, 4 Drawing Sheets

(51) Int. Cl.
  *H01L 33/44*    (2010.01)
  *H01L 33/12*    (2010.01)
  *G02F 1/13*    (2006.01)
  *G06F 1/16*    (2006.01)
  *G09F 9/30*    (2006.01)
  *H01L 23/00*    (2006.01)
  *G02F 1/1333*    (2006.01)

(52) U.S. Cl.
  CPC ............ *G06F 1/1652* (2013.01); *G09F 9/301* (2013.01); *H01L 23/564* (2013.01); *H01L 33/12* (2013.01); *H01L 33/44* (2013.01); *H01L 51/0097* (2013.01); *H01L 51/52* (2013.01); *H01L 2251/303* (2013.01); *H01L 2251/5338* (2013.01)

(58) Field of Classification Search
  CPC ............... H01L 51/52; H01L 2251/303; H01L 2251/5338; H01L 33/12; G06F 1/133305; G06F 1/1652; G06F 1/1641; G09F 9/301
  See application file for complete search history.

(56) References Cited

U.S. PATENT DOCUMENTS

| | | | |
|---|---|---|---|
| 9,263,676 B2* | 2/2016 | Lee | H01L 51/5256 |
| 9,367,162 B2* | 6/2016 | Lee | H01L 51/5256 |
| 9,425,428 B2* | 8/2016 | Jung | H01L 51/5253 |
| 9,496,518 B2* | 11/2016 | Kwack | H01L 51/5253 |
| 9,627,647 B2 | 4/2017 | Kim et al. | |
| 9,966,567 B2 | 5/2018 | Kim et al. | |
| 9,972,807 B2* | 5/2018 | Oh | H01L 51/0031 |
| 10,622,587 B2* | 4/2020 | Hong | H01L 51/0097 |
| 2007/0132381 A1* | 6/2007 | Hayashi | H01L 51/5253 313/512 |
| 2011/0156578 A1* | 6/2011 | Jeon | H01L 51/5253 313/506 |
| 2014/0027722 A1 | 1/2014 | Lee et al. | |
| 2014/0078458 A1* | 3/2014 | Fukushima | H01L 27/1218 349/158 |
| 2014/0367644 A1* | 12/2014 | Song | H01L 51/5256 438/26 |
| 2015/0115235 A1* | 4/2015 | Lee | H01L 51/5253 257/40 |
| 2015/0162565 A1* | 6/2015 | Ryu | H01L 51/5256 257/40 |
| 2015/0368790 A1* | 12/2015 | Huh | C23C 16/54 204/298.09 |
| 2016/0093828 A1* | 3/2016 | Kim | H01L 51/5253 257/40 |
| 2016/0211425 A1* | 7/2016 | Tsujimoto | H01L 33/0012 |
| 2017/0104178 A1* | 4/2017 | Okada | H01L 51/0097 |
| 2017/0213999 A1 | 7/2017 | Kim et al. | |
| 2018/0040847 A1 | 2/2018 | Lee | |
| 2018/0076417 A1 | 3/2018 | Song et al. | |
| 2018/0088392 A1* | 3/2018 | Park | B32B 7/06 |
| 2018/0212192 A1* | 7/2018 | Jin | H01L 51/5237 |
| 2019/0036076 A1* | 1/2019 | Tang | H01L 51/5256 |
| 2019/0067643 A1* | 2/2019 | Zhai | H01L 27/3258 |
| 2019/0189964 A1 | 2/2019 | Jin et al. | |
| 2019/0123301 A1* | 4/2019 | Lee | H01L 51/5253 |
| 2019/0136075 A1* | 5/2019 | Lassiter | C09D 11/107 |
| 2019/0148764 A1* | 5/2019 | Seok | H01M 10/0565 429/317 |
| 2019/0302499 A1* | 10/2019 | Yu | H01L 51/5256 |
| 2019/0312230 A1* | 10/2019 | Ochi | H05B 33/02 |
| 2020/0274096 A1* | 8/2020 | Wang | H01L 51/56 |
| 2020/0295302 A1* | 9/2020 | Yun | H01L 51/5253 |
| 2020/0303681 A1* | 9/2020 | Cho | H01L 27/3276 |
| 2020/0381663 A1* | 12/2020 | Furuie | H01L 51/5253 |
| 2020/0401251 A1* | 12/2020 | Kwon | H01L 27/322 |
| 2021/0336202 A1* | 10/2021 | Lin | H01L 51/5256 |

FOREIGN PATENT DOCUMENTS

| | | |
|---|---|---|
| CN | 107565038 A | 1/2018 |
| CN | 108269827 A | 7/2018 |
| CN | 108511630 A | 9/2018 |
| CN | 108832028 A | 11/2018 |
| CN | 109285958 A | 1/2019 |
| CN | 109686857 A | 4/2019 |
| CN | 107565038 B | 9/2019 |
| CN | 110518146 A | 11/2019 |
| EP | 3477725 A2 | 5/2019 |
| JP | 2019139884 A | 8/2019 |
| KR | 20150045329 A | 4/2015 |
| KR | 20170002052 A | 1/2017 |
| KR | 20190016635 A | 2/2019 |
| RU | 2665816 C1 | 9/2018 |
| WO | 2019075714 A1 | 4/2019 |
| WO | 2021037254 A1 | 3/2021 |

OTHER PUBLICATIONS

Written Opinion for International Application No. PCT/CN2020/112299 dated Dec. 2, 2020.
First Office Action for RU Patent Application No. 2021118401 dated Nov. 10, 2021.
First Examination Report for Australian Patent Application No. 2020338944.
First Office Action for Korean Patent Application No. 10-2020-7037817 dated Jul. 20, 2022.
Extended European Search Report for EP Patent Application No. 20824071.3 dated Oct. 7, 2022.

* cited by examiner

THIN FILM PACKAGING STRUCTURE AND DISPLAY PANEL

CROSS-REFERENCE TO RELATED APPLICATION

This application is based on, claims the benefit of, and claims priority to Chinese Patent Application No. 201910812392.4, filed on Aug. 30, 2019, the entire contents of which are incorporated herein by reference.

TECHNICAL FIELD

This disclosure relates to the field of display technologies and, in particular, to a thin film packaging structure and a display panel.

BACKGROUND

With the continued expansion of the application field of flexible organic light-emitting diode (OLED) display panels, there are increased reliability requirements of flexible OLED devices in severe environments.

At present, in order to prevent water and oxygen from getting into OLED devices, thin film packaging technologies are usually applied to perform packaging. A traditional thin film packaging structure includes inorganic layers and organic layers that are successively stacked. The inorganic layer of thin film packaging structure experiences greater stresses when it is bended, so that the inorganic layer may be easily broken. Alternatively, film layers of the thin film packaging structure may be easily separated, reducing the bendability of the display panel.

It should be noted that the information disclosed in the above "Background" section is merely intended to reinforce understanding of the background technology of the present disclosure and, accordingly, the Background may include information that does not constitute the prior art as already known by an ordinary person skilled in the art.

BRIEF SUMMARY

An objective of this disclosure is to provide a thin film packaging structure and a display panel, which have good bending performance.

A first aspect of the present disclosure provides a thin film packaging structure, which includes: a first inorganic packaging layer for covering a device to be packaged; an organic packaging layer formed at a side of the first inorganic packaging layer; a second inorganic packaging layer formed at a side of the organic packaging layer facing away from the first inorganic packaging layer; and at least one first inorganic adjusting layer formed at a side of the first inorganic packaging layer facing away from the device to be packaged. The first inorganic adjusting layer has an elasticity modulus greater than that of first inorganic packaging layer and the second inorganic packaging layer.

In one exemplary embodiment of the present disclosure, one of the at least one first inorganic adjusting layer is formed between the first inorganic packaging layer and the organic packaging layer.

In one exemplary embodiment of the present disclosure, one of the at least one first inorganic adjusting layer is formed between the organic packaging layer and the second inorganic packaging layer.

In one exemplary embodiment of the present disclosure, a thickness of the first inorganic adjusting layer between the second inorganic packaging layer and the organic packaging layer is less than a thickness of the first inorganic adjusting layer between the first inorganic packaging layer and the organic packaging layer.

In one exemplary embodiment of the present disclosure, a thickness of the first inorganic adjusting layer between the first inorganic packaging layer and the organic packaging layer is less than a thickness of the first inorganic adjusting layer between the second inorganic packaging layer and the organic packaging layer.

In one exemplary embodiment of the present disclosure, one of the at least one first inorganic adjusting layer is formed at a side of the second inorganic packaging layer facing away from the organic packaging layer.

In one exemplary embodiment of the present disclosure, one of the at least one first inorganic adjusting layer is formed at a side of the first inorganic packaging layer facing towards the device to be packaged.

In one exemplary embodiment of the present disclosure, the thin film packaging structure further includes: a second inorganic adjusting layer formed at a side of the first inorganic packaging layer facing towards the device to be packaged; wherein a refractive index of the second inorganic adjusting layer is lower than a refractive index of the first inorganic packaging layer.

In one exemplary embodiment of the present disclosure, the second inorganic adjusting layer is made of lithium fluoride.

In one exemplary embodiment of the present disclosure, the first inorganic adjusting layer is made of silicon oxide.

In one exemplary embodiment of the present disclosure, the silicon oxide has a thickness of 10 nm to 100 nm.

A second aspect of the present disclosure provides a display panel, which includes: a device to be packaged; and the thin film packaging structure of any one of the above embodiments.

According to a thin film packaging structure and a display panel, a first inorganic adjusting layer having a greater elasticity modulus at a side of the first inorganic packaging layer facing away from the device to be packaged, increasing the stability of the thin film packaging structure in the process of bending to avoid the thin film packaging structure from being broken, or prevent separation between film layers, ensuring the packaging stability of the film packaging structure, and thereby improving the bending performance and service life of the display panel.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure. It should be apparent that the drawings in the following description are merely examples of this disclosure, and that other drawings may also be obtained by those ordinary skilled in the art without creative work.

DETAILED DESCRIPTION

Figure 1:
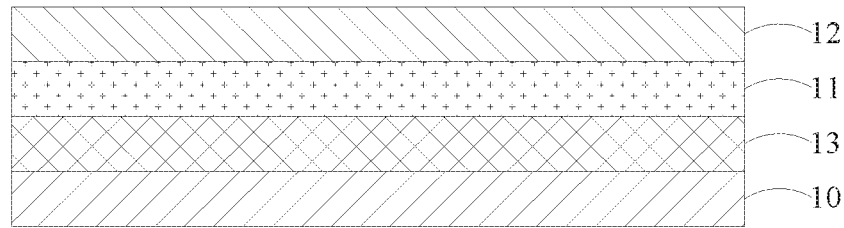
FIGS. 1-16 respectively show schematic views of thin film packaging structures according to different embodiments of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. The same reference numerals denote the same or similar structures in the drawings, and thus their detailed descriptions will be omitted. In addition, the drawings are merely schematic illustrations of the present disclosure, and are not necessarily drawn to scale.

Although relative terms such as "above" and "under" are used herein to describe the relationship of one component relative to another component, such terms are used herein only for the sake of convenience, for example, in the direction shown in the figure, it should be understood that if the referenced device is inversed upside down, a component described as "above" will become a component described as "under." When a structure is described as "above" another structure, it probably means that the structure is integrally formed on another structure, or, the structure is "directly" disposed on another structure, or, the structure is "indirectly" disposed on another structure through an additional structure.

An embodiment of the present disclosure provides a thin film packaging structure, which has certain bendability. Specifically, as shown in FIGS. 1-16, the thin film packaging structure may include a first inorganic packaging layer 10, an organic packaging layer 11, a second inorganic packaging layer 12, and at least one first inorganic adjusting layer 13.

The first inorganic packaging layer 10 is used to cover a device to be packaged, where the device to be packaged may be an OLED device. That is to say, the OLED device may be packaged using the thin film packaging structure. The OLED device is packaged by the first inorganic packaging layer 10 to prevent water and oxygen from getting into the OLED device and thus, ensure the service life of the OLED device.

For example, the first inorganic packaging layer 10 may be made of silicon oxynitride. The silicon oxynitride may be deposited on a surface of the device to be packaged through the chemical vapor deposition (CVD) method to package the device.

The organic packaging layer 11 may be formed at a side of the first inorganic packaging layer 10. The organic packaging layer 11 is provided, on one hand, to improve flatness of the thin film packaging structure and, on the other hand, to improve the bending capability of the entire thin film packaging structure. For example, the organic packaging layer 11 may be an inkjet printing layer formed by inkjet printing with an organic liquid. The second inorganic packaging layer 12 may be formed at a side of the organic packaging layer 11 facing away from the first inorganic packaging layer 10. The second inorganic packaging layer 12 is provided to further improve the packaging effect of the thin film packaging structure. For example, the second inorganic packaging layer 12 may be made of silicon nitride. The silicon nitride may be deposited on the organic packaging layer 11 by chemical vapor deposition.

The first inorganic adjusting layer 13 may be formed at a side of the first inorganic packaging layer 10 facing away from the device to be packaged. An elasticity modulus of the first inorganic adjusting layer 13 is greater than elasticity modulus of the first inorganic packaging layer 10 or the second inorganic packaging layer 12. In this embodiment, a first inorganic adjusting layer 13 having a greater elasticity modulus is provided at the side of the first inorganic packaging layer 10 facing away from the device to be packaged to increase the stability of the thin film packaging structure in a bending process to avoid the thin film packaging structure from being broken, or prevent separation between film layers, thereby ensuring the packaging stability of the film packaging structure, and thereby improving the bending performance and service life of the display panel.

The thickness of the first inorganic adjusting layer 13 may be 10 nm to 100 nm, for example, 10 nm, 30 nm, 50 nm, 70 nm, 90 nm, 100 nm, etc., that is, the thickness of the first inorganic adjusting layer 13 may be between 10 nm and 100 nm. In this embodiment, the thickness of the first inorganic adjusting layer 13 is designed to be between 10 nm and 100 nm, on one hand, to avoid the situation that the first inorganic adjusting layer 13 is too thin to adjust the position of the stress neutral layer, on the other hand, to avoid the situation that the first inorganic adjusting layer 13 is too thick and thus leading to lower light-emitting efficiency of the thin film package structure.

For example, the first inorganic adjusting layer 13 may be made of silicon oxide. The silicon oxide may be deposited at a side of the first inorganic packaging layer 10 by chemical vapor deposition, and the silicon oxide has characteristics of high elasticity modulus, high transmission rate, and the like, so that the transmission rate of the thin film packaging structure may be improved while the structural stability of the thin film packaging structure is improved. In addition, since the thickness of the silicon oxide is easy to be controlled, silicon oxide is used as the first inorganic adjusting layer 13, and the thickness of the first inorganic adjusting layer 13 may be adjusted according to practical problems that occur in the bending process of the thin film packaging structure, so that the stress neutral layer at the bending position is closer to the inorganic packaging layer which is easy to be broken or separated.

It should be noted that, this embodiment may adjust the thickness of the first inorganic adjusting layer 13 according to the practical problems that occur in the bending process of the thin film packaging structure so that the stress neutral layer at the bending position may be closer to the inorganic packaging layer which is easy to be broken or separated. Also, the positional relationships between the first inorganic adjusting layer 13 and the first inorganic packaging layer 10 and the second inorganic packaging layer 12 may be adjusted according to the practical problems that occur in the bending process of the thin film packaging structure, so that the stress neutral layer at the bending position may be closer to the inorganic packaging layer which is easy to be broken or separated.

The structure of the thin film packaging structure will be described in detail below with reference to the accompanying drawings.

In an embodiment of the present disclosure, if the first inorganic packaging layer 10 of the thin film packaging structure is more easily broken or separated from other film layers during the actual bending process of the display panel, as shown in FIG. 1, the first inorganic adjusting layer 13 may be formed between the first inorganic packaging layer 10 and the organic packaging layer 11, so that the stress neutral layer at the bending position may be offset towards the first inorganic packaging layer 10, that is, the distance between the first inorganic packaging layer 10 and the stress neutral layer is reduced, as such, compared to the solution that the first inorganic packaging layer 10 is directly combined with the organic packaging layer 11 in the prior art, the deformation amount of the first inorganic packaging layer 10 may be reduced as reaching the same bending radius, to alleviate the situation that the first inorganic packaging layer 10 may be broken or separated from other film layers in the bending process, and further ensure the stability of the thin film packaging structure, so that the packaging effect of the thin film packaging structure can be improved.

It should be noted that, when the first inorganic adjusting layer 13 is made of silicon oxide, and the first inorganic packaging layer 10 is made of silicon oxynitride, an oxygen content of the first inorganic adjusting layer 13 is greater than an oxygen content of the first inorganic packaging layer 10, so that a contact angle between the first inorganic adjusting layer 13 and the organic packaging layer 11 is smaller than a contact angle between the first inorganic packaging layer 10 and the organic packaging layer 11. Therefore, after curing, a bonding strength between the first inorganic adjusting layer 13 and the organic packaging layer 11 is greater than a bonding strength between the first inorganic packaging layer 10 and the organic packaging layer 11.

In this embodiment, compared with the situation that the first inorganic packaging layer 10 is directly combined with the organic packaging layer 11, the first inorganic adjusting layer 13 is formed between the first inorganic packaging layer 10 and the organic packaging layer 11 to increase the combination stability between the first inorganic packaging layer 10 and the organic packaging layer 11, and avoid the interlayer separation between the first inorganic packaging layer 10 and the organic packaging layer 11, thereby ensuring the stability of the thin film packaging structure and improving the packaging effect of the thin film packaging structure.

In an embodiment of the present disclosure, when the first inorganic adjusting layer 13 is made of silicon oxide, and the second inorganic packaging layer 12 is made of silicon nitride, the oxygen content of the first inorganic adjusting layer 13 is greater than the oxygen content of the second inorganic packaging layer 12 so that the contact angle between the first inorganic adjusting layer 13 and the organic packaging layer 11 is smaller than the contact angle between the second inorganic packaging layer 12 and the organic packaging layer 11. After curing, the bonding strength between the first inorganic adjusting layer 13 and the organic packaging layer 11 may be greater than the bonding strength between the second inorganic packaging layer 12 and the organic packaging layer 11.

Figure 2:
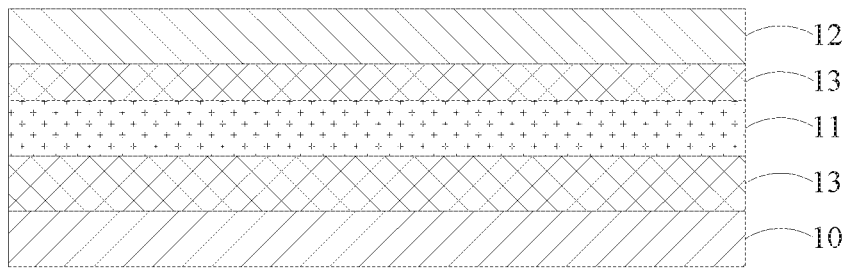

As shown in FIG. 2, relative to the previous embodiment, apart from that the first inorganic adjusting layer 13 is formed between the first inorganic packaging layer 10 and the organic packaging layer 11, the first inorganic adjusting layer 13 may also be formed between the second inorganic packaging layer 12 and the organic packaging layer 11, in comparison with the direct combination between the second inorganic packaging layer 12 and the organic packaging layer 11, the combination stability between the second inorganic packaging layer 12 and the organic packaging layer 11 may be increased, and the interlayer separation between the second inorganic packaging layer 12 and the organic packaging layer 11 may be avoided, so that the stability of the thin film packaging structure may be ensured, and the packaging effect of the thin film packaging structure may be improved.

It should be noted that, in the actual bending process, if the stress neutral layer is at a side of the first inorganic packaging layer 10 or the second inorganic packaging layer 12, the stress neutral layer may be further offset towards the first inorganic packaging layer 10 or the second inorganic packaging layer 12 as described in this embodiment, to reduce the distance between the first or second inorganic packaging layer 10 or 12 and the stress neutral layer, and reduce the deformation amount of the first inorganic packaging layer 10 and/or the second inorganic packaging layer 12, thereby alleviating the situation that the first inorganic packaging layer 10 and/or the second inorganic packaging layer 12 are/is broken or separated from other film layers in the bending process, and further ensuring the stability of the thin film packaging structure, such that the packaging effect of the thin film packaging structure can be improved.

It should be noted that the thickness of the first inorganic adjusting layer 13 between the second inorganic packaging layer 12 and the organic packaging layer 11 may be smaller than the thickness of the first inorganic adjusting layer 13 between the first inorganic packaging layer 10 and the organic packaging layer 11, but is not limited thereto, and may be greater than or equal to the thickness of the first inorganic adjusting layer 13 between the first inorganic packaging layer 10 and the organic packaging layer 11 according to the specific situations.

Figure 3:
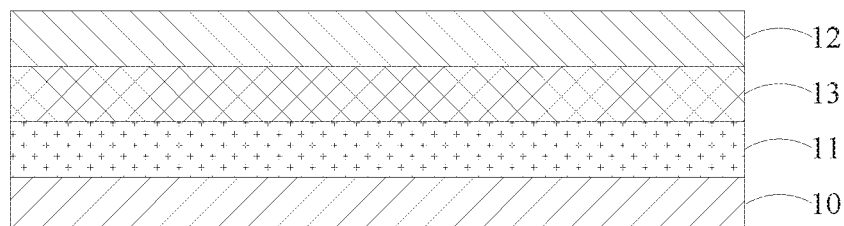
Figure 4:
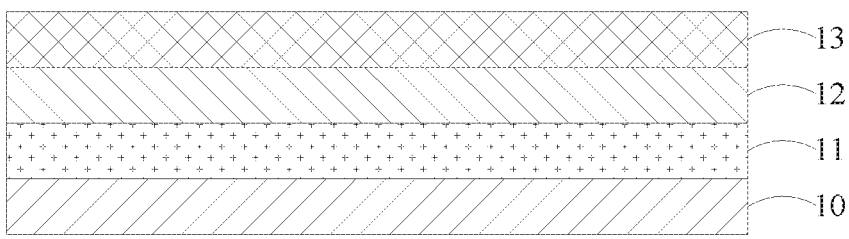
Figure 5:
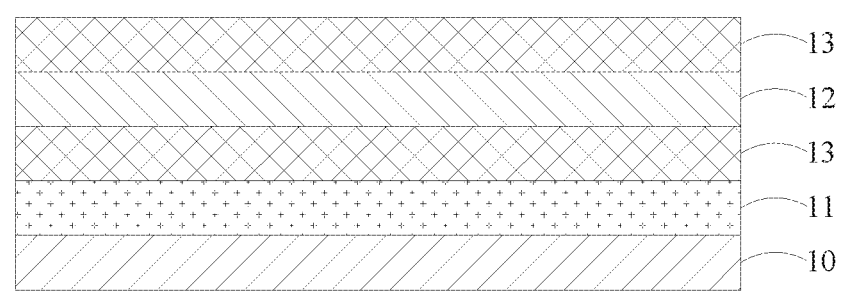

In an embodiment of the present disclosure, if the second inorganic packaging layer 12 of the thin film packaging structure is more likely to be broken or separated from other film layers during the actual bending process of the display panel, the first inorganic adjusting layer 13 may be formed between the second inorganic packaging layer 12 and the organic packaging layer 11, as shown in FIG. 3; or the first inorganic adjusting layer 13 is formed at a side of the second inorganic packaging layer 12 facing away from the organic packaging layer 11, as shown in FIG. 4; or a first inorganic adjusting layer 13 is formed between the second inorganic packaging layer 12 and the organic packaging layer 11, and another first inorganic adjusting layer 13 is formed at a side of the second inorganic packaging layer 12 facing away from the organic packaging layer 11, as shown in FIG. 5. With these solutions, the stress neutral layer at the bending position may be offset towards the second inorganic packaging layer 12, i.e., the distance between the second inorganic packaging layer 12 and the stress neutral layer may be reduced, so that compared to the traditional manner that the second inorganic packaging layer 12 is directly combined with the organic packaging layer 11, the deformation amount of the second inorganic packaging layer 12 may be reduced when the bending radius is consistent, alleviating the situation that the first inorganic packaging layer 10 may be broken or separated from other film layers in the bending process, and then ensuring the stability of the thin film packaging structure, so that the packaging effect of the thin film packaging structure may be improved.

It should be noted that, when the first inorganic adjusting layer 13 is made of silicon oxide and the second inorganic packaging layer 12 is made of silicon nitride, the oxygen content of the first inorganic adjusting layer 13 is greater than the oxygen content of the second inorganic packaging layer 12, so that the contact angle between the first inorganic adjusting layer 13 and the organic packaging layer 11 is smaller than the contact angle between the second inorganic packaging layer 12 and the organic packaging layer 11. Therefore, after curing, the bonding strength between the first inorganic adjusting layer 13 and the organic packaging layer 11 is greater than the bonding strength between the second inorganic packaging layer 12 and the organic packaging layer 11.

In the embodiment, preferably, the first inorganic adjusting layer 13 is formed between the second inorganic packaging layer 12 and the organic packaging layer 11, and compared to the situation that the second inorganic packaging layer 12 is directly combined with the organic packaging layer 11, the combination stability between the second inorganic packaging layer 12 and the organic packaging layer 11 may be further increased, and the interlayer separation between the second inorganic packaging layer 12 and the organic packaging layer 11 may be avoided, thereby ensuring the stability of the thin film packaging structure, and improving the packaging effect of the thin film packaging structure.

In an embodiment of the present disclosure, when the first inorganic adjusting layer 13 is made of silicon oxide, and the first inorganic packaging layer 10 is made of silicon oxynitride, the oxygen content of the first inorganic adjusting layer 13 is greater than the oxygen content of the first inorganic packaging layer 10, so that the contact angle between the first inorganic adjusting layer 13 and the organic packaging layer 11 is smaller than the contact angle between the first inorganic packaging layer 10 and the organic packaging layer 11. After curing, the bonding strength between the first inorganic adjusting layer 13 and the organic packaging layer 11 is greater than the bonding strength between the first inorganic packaging layer 10 and the organic packaging layer 11.

Figure 6:
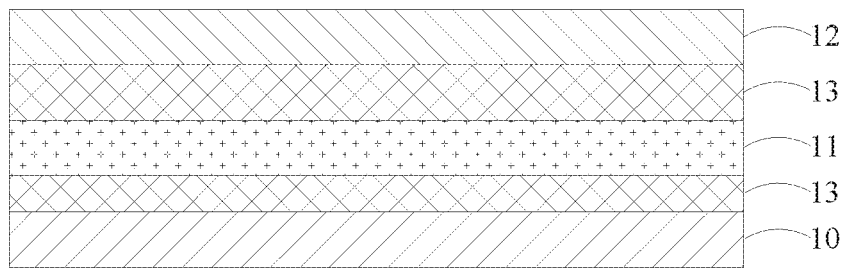
Figure 7:
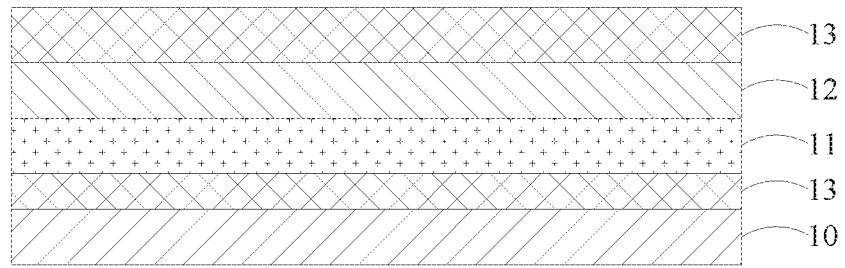
Figure 8:
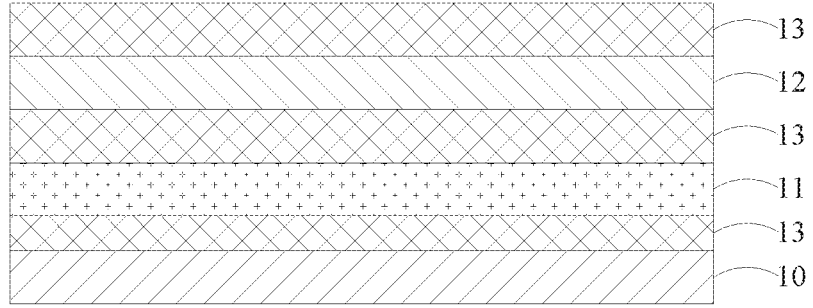
Figure 9:
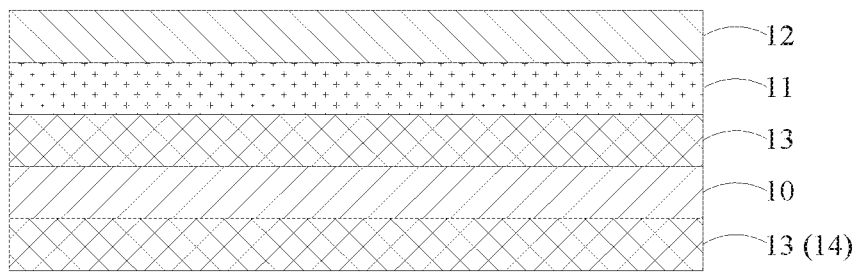
Figure 10:
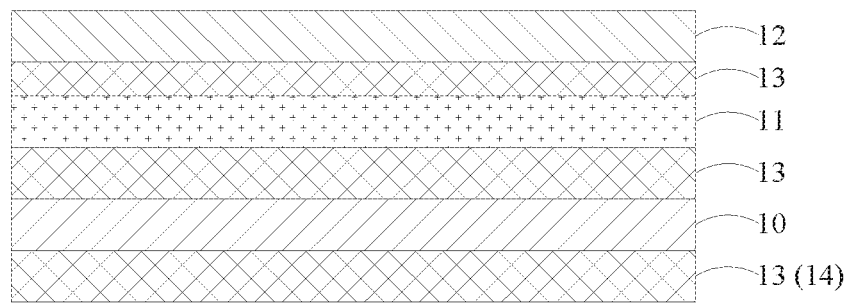
Figure 11:
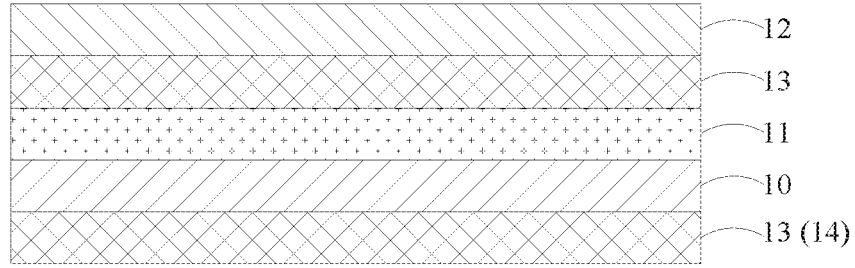
Figure 12:
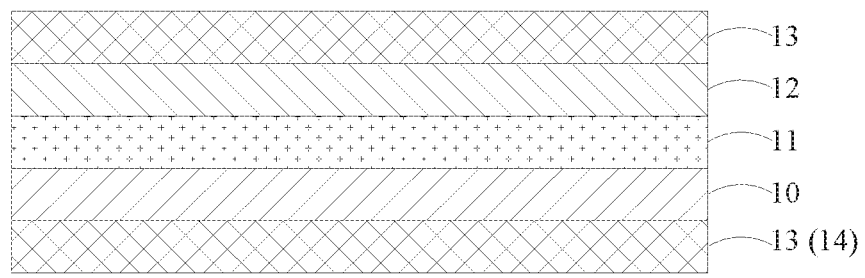
Figure 13:
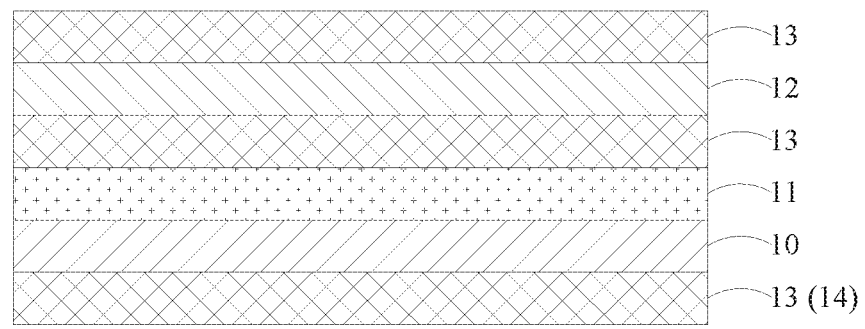
Figure 14:
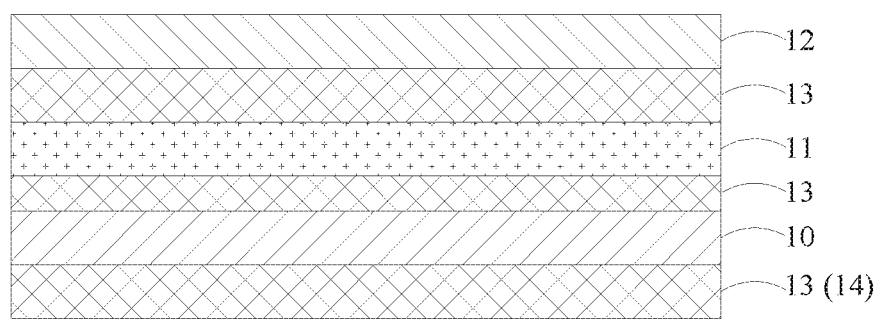
Figure 15:
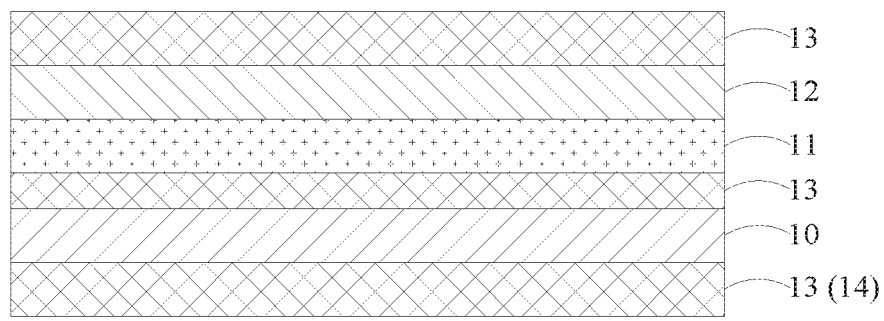
Figure 16:
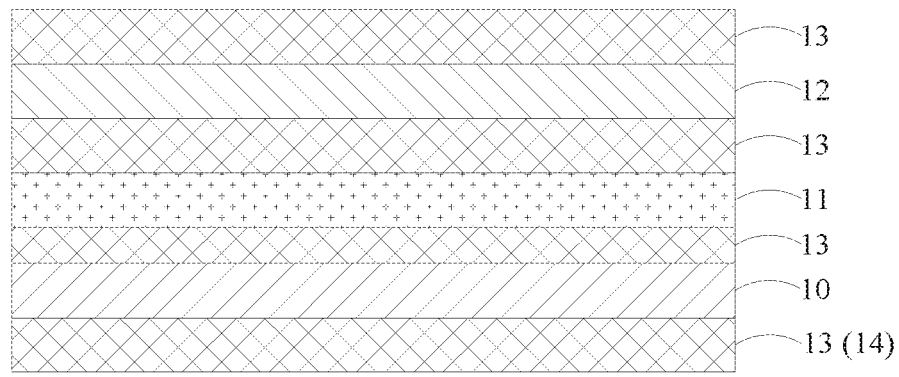

As shown in FIGS. 6 to 8, compared to the previous embodiment (see FIGS. 3 to 5), in addition to forming the first inorganic adjusting layer 13 between the second inorganic packaging layer 12 and the organic packaging layer 11, and/or in addition to forming the first inorganic adjusting layer 13 at a side of the second inorganic packaging layer 12 facing away from the organic packaging layer 11, a first inorganic adjusting layer 13 may also be formed between the first inorganic packaging layer 10 and the organic packaging layer 11, which may increase the combination stability between the first inorganic packaging layer 10 and the organic packaging layer 11, and may prevent the first inorganic packaging layer 10 and the organic packaging layer 11 from being separated from each other, thereby ensuring the stability of the thin film packaging structure and improving the packaging effect of the thin film packaging structure, compared to the situation that the first inorganic packaging layer 10 is directly combined with the organic packaging layer 11 in the prior art.

It should be noted that, in the actual bending process, if the stress neutral layer is at a side of the first inorganic packaging layer 10 or the second inorganic packaging layer 12, the stress neutral layer of this embodiment may be further offset towards the first inorganic packaging layer 10 or the second inorganic packaging layer 12, so as to reduce the distance between the first inorganic packaging layer 10 or the second inorganic packaging layer 12 and the stress neutral layer, reduce the deformation amount of the first inorganic packaging layer 10 and the second inorganic packaging layer 12, and alleviate the situation that the first inorganic packaging layer 10 or the second inorganic packaging layer 12 is broken or separated from other film layers in the bending process, thereby ensuring the stability of the thin film packaging structure, and improving the packaging effect of the thin film packaging structure.

It should be noted that, the thickness of the first inorganic adjusting layer 13 between the first inorganic packaging layer 10 and the organic packaging layer 11 may be smaller than the thickness of the first inorganic adjusting layer 13 between the second inorganic packaging layer 12 and the organic packaging layer 11, but is not limited thereto, and may be greater than or equal to the thickness of the first inorganic adjusting layer 13 between the second inorganic packaging layer 12 and the organic packaging layer 11 according to the specific situations.

In an embodiment of the present disclosure, as shown in FIGS. 9-16, the main difference from any of the previous embodiments is that, a first inorganic adjusting layer 13 is also provided at a side of the first inorganic packaging layer 10 facing towards the device to be packaged. The first inorganic adjusting layer 13 is provided so that the stress neutral layer may be offset towards the first inorganic packaging layer 10, or may be offset towards the first inorganic packaging layer 10 and the second inorganic packaging layer 12 at the same time, depending on an initial position of the stress neutral layer, so as to alleviate the situation that the first inorganic packaging layer 10 and the second inorganic packaging layer 12 are broken or separated from other film layers during the bending process, and ensure the stability of the thin film packaging structure, and improve the packaging effect of the thin film packaging structure.

In addition, the first inorganic adjusting layer 13 of the embodiment is made of silicon oxide, which does not absorb water and has a good capability of blocking water and oxygen, so as to further prevent water and oxygen from getting into the device to be packaged, thereby improving the reliability of the product. Also, the silicon oxide has lower refractive index, and the light extraction efficiency is not influenced.

Alternatively, as shown in FIGS. 9-16, the main difference from any of the previous embodiments (see FIGS. 1 to 8) is that, a second inorganic adjusting layer 14 is provided at a side of the first inorganic packaging layer 10 facing towards the device to be packaged. The refractive index of the second inorganic adjusting layer 14 is lower than the refractive index of the first inorganic packaging layer 10, and alternatively, the second inorganic adjusting layer 14 may be made of lithium fluoride.

When the thin film packaging structure of the embodiment is applied to package a display device, the light emitting efficiency of the display panel may be improved.

It should be noted that the first inorganic adjusting layer 13 of any of the above embodiments is not limited to silicon oxide, but may also be silicon oxynitride, as long as the oxygen content of the first inorganic adjusting layer 13 is greater than that of the first inorganic packaging layer 10 to achieve characteristics of high elasticity modulus and high bonding strength.

A second aspect of the present disclosure provides a display panel, which can be applied to display devices such as mobile phones and computers. The display panel may include a device to be packaged (not shown in the figures) and a thin film packaging structure for packaging the device to be packaged, where the device to be packaged may be an OLED display device, and the thin film packaging structure may be a thin film packaging structure described in any of the above embodiments, and details will not be repeated here. The display panel of the present embodiment may be a flexible display panel.

The terms "a," "an," "the," "said," and "at least one" are used to express the presence of one or more the element, component, or the like. The terms "comprise," "include," and "have" are intended to be inclusive, and mean there may be additional elements, components, or the like other than the listed elements, components, or the like. The terms "first" and "second" are used only as labels, and are not numerical restriction to the objects.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

What is claimed is:

1. A thin film packaging structure, comprising:
   a first inorganic packaging layer for covering a device to be packaged;
   an organic packaging layer formed at a side of the first inorganic packaging layer;
   a second inorganic packaging layer formed at a side of the organic packaging layer facing away from the first inorganic packaging layer; and
   at least one first inorganic adjusting layer formed at a side of the first inorganic packaging layer facing away from the device to be packaged, the at least one first inorganic adjusting layer having an elasticity modulus greater than that of the first inorganic packaging layer and the second inorganic packaging layer,
   wherein the at least one first inorganic adjusting layer is a plurality of first inorganic adjusting layers, and one of the first inorganic adjusting layers is formed between the first inorganic packaging layer and the organic packaging layer.

2. The thin film packaging structure of claim 1, wherein one of the first inorganic adjusting layers is formed between the organic packaging layer and the second inorganic packaging layer.

3. The thin film packaging structure of claim 2, wherein a thickness of the one of the first inorganic adjusting layers between the second inorganic packaging layer and the organic packaging layer is less than a thickness of the one of the first inorganic adjusting layers between the first inorganic packaging layer and the organic packaging layer.

4. The thin film packaging structure of claim 2, wherein the one of the first inorganic adjusting layers is formed at a side of the second inorganic packaging layer facing away from the organic packaging layer.

5. The thin film packaging structure of claim 1, wherein the one of the first inorganic adjusting layers is formed at a side of the first inorganic packaging layer facing towards the device to be packaged.

6. A thin film packaging structure, comprising:
   a first inorganic packaging layer for covering a device to be packaged;
   an organic packaging layer formed at a side of the first inorganic packaging layer;
   a second inorganic packaging layer formed at a side of the organic packaging layer facing away from the first inorganic packaging layer; and
   at least one first inorganic adjusting layer formed at a side of the first inorganic packaging layer facing away from the device to be packaged, the at least one first inorganic adjusting layer having an elasticity modulus greater than that of the first inorganic packaging layer and the second inorganic packaging layer,
   wherein the at least one first inorganic adjusting layer is a plurality of first inorganic adjusting layers, and one of first inorganic adjusting layers is formed between the organic packaging layer and the second inorganic packaging layer.

7. The thin film packaging structure of claim 6, wherein one of the first inorganic adjusting layers is formed between the first inorganic packaging layer and the organic packaging layer.

8. The thin film packaging structure of claim 7, wherein a thickness of the one of the first inorganic adjusting layers between the first inorganic packaging layer and the organic packaging layer is less than a thickness of the one of the first inorganic adjusting layers between the second inorganic packaging layer and the organic packaging layer.

9. A thin film packaging structure, comprising:
   a first inorganic packaging layer for covering a device to be packaged;
   an organic packaging layer formed at a side of the first inorganic packaging layer;
   a second inorganic packaging layer formed at a side of the organic packaging layer facing away from the first inorganic packaging layer; and
   at least one first inorganic adjusting layer formed at a side of the first inorganic packaging layer facing away from the device to be packaged, the at least one first inorganic adjusting layer having an oxygen content greater than that of the first inorganic packaging layer and/or the second inorganic packaging layer,
   wherein the at least one first inorganic adjusting layer comprises two first inorganic adjusting layers, one of the two first inorganic adjusting layers is between the first inorganic packaging layer and the organic packaging layer, and the other of the two first inorganic adjusting layers is between the second inorganic packaging layer and the organic packaging layer.

10. The thin film packaging structure of claim 9, wherein an oxygen content of the first inorganic adjusting layer between the first inorganic packaging layer and the organic packaging layer is greater than that of the first inorganic packaging layer; and an oxygen content of the first inorganic adjusting layer between the second inorganic packaging layer and the organic packaging layer is greater than that of the second inorganic packaging layer.

11. The thin film packaging structure of claim 9, wherein a thickness of the first inorganic adjusting layer between the first inorganic packaging layer and the organic packaging layer is greater than that of the first inorganic adjusting layer between the second inorganic packaging layer and the organic packaging layer.

12. The thin film packaging structure of claim 9, wherein a material of the first inorganic adjusting layer between the first inorganic packaging layer and the organic packaging layer is same as that of the first inorganic packaging layer.

13. The thin film packaging structure of claim 9, wherein a material of the first inorganic adjusting layer between the second inorganic packaging layer and the organic packaging layer is different from that of the second inorganic packaging layer.

14. The thin film packaging structure of claim 9, wherein a material of the first inorganic packaging layer comprises silicon oxynitride.

15. The thin film packaging structure of claim 9, wherein a material of the second inorganic packaging layer comprises silicon nitride.

16. The thin film packaging structure of claim 9, wherein a material of the first inorganic adjusting layer between the second inorganic packaging layer and the organic packaging layer comprises silicon oxide.

17. The thin film packaging structure of claim 9, wherein a material of the first inorganic adjusting layer between the first inorganic packaging layer and the organic packaging layer comprises silicon oxynitride.

18. A display panel comprising the thin film packaging structure of claim 9 and the device to be packaged.

19. The display panel of claim 18, wherein the device to be packaged comprises an organic light emitting diode device.

* * * * *